(12) United States Patent
Le Ravalec

(10) Patent No.: US 9,135,378 B2
(45) Date of Patent: Sep. 15, 2015

(54) METHOD OF DEVELOPING A RESERVOIR FROM A TECHNIQUE OF SELECTING THE POSITIONS OF WELLS TO BE DRILLED

(71) Applicant: IFP Energies nouvelles, Rueil-Malmaison Cedex (FR)

(72) Inventor: Mickaele Le Ravalec, Rueil-Malmaison (FR)

(73) Assignee: IFP Energies nouvelles, Rueil-Malmaison Cedex (FR)

( * ) Notice: Subject to any disclaimer, the term of this patent is extended or adjusted under 35 U.S.C. 154(b) by 433 days.

(21) Appl. No.: 13/759,373

(22) Filed: Feb. 5, 2013

(65) Prior Publication Data
US 2013/0218537 A1    Aug. 22, 2013

(30) Foreign Application Priority Data
Feb. 16, 2012 (FR) ..................... 12 00461

(51) Int. Cl.
*G06G 7/48* (2006.01)
*G06F 17/50* (2006.01)
(Continued)

(52) U.S. Cl.
CPC ............ *G06F 17/5009* (2013.01); *E21B 43/00* (2013.01); *E21B 43/30* (2013.01);
(Continued)

(58) Field of Classification Search
CPC ........... G01V 1/28; G01V 1/30; G01V 1/306; G06F 17/17; G06F 17/5009; E21B 43/00; E21B 43/30; E21B 2043/0115; G06G 7/48; G06G 7/57
See application file for complete search history.

(56) References Cited

U.S. PATENT DOCUMENTS

| 5,101,898 A | 4/1992 | Hong |
| 2008/0154505 A1* | 6/2008 | Kim et al. ................... 702/2 |

(Continued)

FOREIGN PATENT DOCUMENTS

| EP | 2 270 548 A1 | 1/2011 |
| EP | 2 426 630 A1 | 3/2012 |
| WO | WO 01/23829 A2 | 4/2011 |

OTHER PUBLICATIONS

Vargas-Guzman, J. et al: "Integration of 3D-Seismic Impedance Into High-Resolution Geocellular Models Using Non-Collocated Downscaling," SPE Reservoir Characterization and Simulation Conference and Exhibition, SPE, US. No. SPE 148363, Oct. 9, 2011, pp. 1-10, XP007921324.

(Continued)

*Primary Examiner* — Kandasamy Thangavelu
(74) *Attorney, Agent, or Firm* — Fitch Even Tabin & Flannery

(57) ABSTRACT

The invention relates to a method of developing an underground reservoir, notably a petroleum reservoir, traversed by at least a first well from which a fluid is produced, wherein a position of at least a second well to be drilled is determined by means of a production indicator map comprising a set of cells, each cell being associated with a production indicator defining an impact, on the fluid production, of a well addition in this cell. The method comprises constructing the map by:
  a) determining production indicators on a first group of cells of the map;
  b) determining production indicators on a second group of cells of the map;
  c) interpolating said production indicators on all the cells of the map; and
defining the position of the second well by the cell where the production indicator is maximal.

31 Claims, 4 Drawing Sheets

(51) Int. Cl.
*G01V 1/28* (2006.01)
*E21B 43/00* (2006.01)
*G06F 17/17* (2006.01)
*G01V 1/30* (2006.01)
*G06G 7/57* (2006.01)
*E21B 43/30* (2006.01)
*E21B 43/01* (2006.01)

(52) U.S. Cl.
CPC .................. *G01V 1/28* (2013.01); *G01V 1/306* (2013.01); *G06F 17/17* (2013.01); *G06G 7/57* (2013.01); *E21B 2043/0115* (2013.01)

(56) References Cited

U.S. PATENT DOCUMENTS

| | | | | |
|---|---|---|---|---|
| 2009/0216505 | A1* | 8/2009 | Sarma et al. | 703/2 |
| 2010/0125349 | A1* | 5/2010 | Abasov et al. | 700/90 |
| 2010/0286971 | A1* | 11/2010 | Middya et al. | 703/10 |
| 2010/0332205 | A1 | 12/2010 | Tillier et al. | |
| 2011/0295510 | A1* | 12/2011 | Gulati | 702/16 |
| 2012/0059634 | A1 | 3/2012 | Bouzarkouna et al. | |
| 2012/0136641 | A1* | 5/2012 | Fung et al. | 703/10 |
| 2012/0158378 | A1* | 6/2012 | Enchery | 703/2 |
| 2013/0140037 | A1* | 6/2013 | Sequeira et al. | 166/369 |

OTHER PUBLICATIONS

Ren, Welshan, et al: "Quantifying resources for the Surmont Lease With 2D Mapping and Multivariate Statistics", SPE Reservoir Evaluation and Engineering, SPE, US, Apr. 1, 2008, pp. 1-11, XP007921323.

Calvalcante, J.S. de A: "Methodology for Quality Map Generation to Assist with the Selection and Refinement of Production Strategies," SPE International Oil and Gas Conference and Exhibition, XX, XX, No. SPE 101940-STU, Oct. 9, 2005, pp. 1-10, XP002676803.

Cottini-Loureiro, A. et al: "Optimized Well Location by Combination of Multiple Realization Approach and Quality Map Methods," SPE 95413, SPE ATCE, Dallas, TX, USA, Oct. 9-12, 2005.

Da Cruz, P.S., et al: "The Quality Map: A Tool for Reservoir Quantification and Decision Making," SPE ATCE, SPE 56578, Houston, TX, USA, 1999.

* cited by examiner

METHOD OF DEVELOPING A RESERVOIR FROM A TECHNIQUE OF SELECTING THE POSITIONS OF WELLS TO BE DRILLED

BACKGROUND OF THE INVENTION

1. Field of the Invention

The present invention relates to the technical sphere of the petroleum industry, and more particularly to the development of underground reservoirs such as petroleum reservoirs or gas storage sites. In particular, the invention allows efficient planning of the development of a reservoir by selecting the positions where new wells are to be drilled, for which the production potential will be maximal.

2. Description of the Prior Art

Optimization and development of petroleum reservoirs is based on the most accurate possible description of the structure, namely, the petrophysical properties, the fluid properties, etc., of the reservoir being studied. A tool is used allowing accounting for these aspects in an approximate way which is a reservoir model. The model is a model of the subsoil, representative of both its structure and its behavior. Generally, this type of model is represented in a computer and is referred to as a "numerical model." A reservoir model comprises a mesh or grid, generally three-dimensional, associated with one or more petrophysical property maps (porosity, permeability, saturation, etc.). The association assigns values of these petrophysical properties to each cell of the grid.

In order to be considered reliable, the reservoir model must meet as much as possible all the data collected in the field which are well-log data measured along wells, measurements performed on rock samples taken in wells, data deduced from seismic acquisition surveys, production data such as oil and water flow rates, pressure data, etc. These data are not sufficient for characterizing precisely the petrophysical property values to be assigned to the cells of the model, which is why a stochastic formalism is generally used. The petrophysical properties are considered as realizations of random functions. A possible image of the reservoir, that is a model, is then generated from geostatistical simulation techniques. Solving flow equations for this model provides production responses. These responses are then compared with the production data measured in the wells. The difference between the simulated responses and the data acquired in the field has to be minimized so as to increase the reservoir model predictivity. This stage involves a calibration or optimization procedure, which is in general consumptive of computation time because it is an iterative process requiring a flow simulation per iteration. Currently, a single flow simulation often requires several hours of computation time. Furthermore, there is not only one reservoir model meeting the production data, but several ones due to the uncertainty on the parameters. One of the dominating factors regarding uncertainties concerning the spatial distribution of the petrophysical properties is geological uncertainty.

When a model meeting the data measured in the field is obtained, it is used to predict the fluid displacements in the reservoir and to plan the future development of the field. For example, for mature fields, it must be possible to select the zones where new wells are to be drilled, either in order to produce oil by depletion drive or to inject a fluid that maintains the pressure at a sufficient level in the reservoir. The performance of a well at a given point can be assessed using the reservoir model by positioning the well in the desired position and carrying out a flow simulation. The performance of a well can be assessed from the amount of hydrocarbons it produces. The final goal being maximization of the production or of the profitability of the field, it should be possible to test all the possible positions and thus to select the best one. Such an approach is inappropriate in practice because it involves too high a computation time. One alternative is launching an optimization procedure intended to have the best location possible for a well to optimize the production. However, this approach remains delicate to implement because it requires several thousand iterations.

The concept of production indicator maps, also referred to as quality maps in the literature, has been introduced in order to deal in a practical manner with the problem of positioning new wells in a reservoir. It is a two-dimensional map comprising a set of cells where each cell is associated with a real value that shows how a new well placed in the cell in question impacts the production or the net present value (NPV) in relation to the base case. The base case corresponds to the initial development scheme. As a scheme for which no new well is added (Da Cruz, P. S., Home, R. N., Deutsch, C., The Quality map: A Tool for Reservoir Quantification and Decision Making, SPE ATCE, SPE 56578, Houston, Tex., USA, 1999).

A production indicator defines an impact on the production of fluid (hydrocarbon) linked with the addition of a well in the cell considered. To construct this map, a flow simulation can be performed for each cell where a well can be positioned. If the reservoir comprises NX and NY cells along axes X and Y, the total number of cells to be examined is NX×NY minus the number of non-active cells and for cells that already have a well for the base case. This approach requires a significant computation time insofar as NX×NY is large.

In order to reduce the computation times, an interpolation approach has been considered (Cottini-Loureiro, A., Araujo, M., Optimized Well Location by Combination of Multiple Realization Approach and Quality Map Methods, SPE 95413, SPE ATCE, Dallas, Tex., USA, 9-12 October, 2005). A simulation is then carried out for some cells of the map, and the values in the other cells are estimated by interpolation.

Moreover, in view of the geological uncertainty being high, several reservoir models meeting the data collected in the field, and not only one model, have to be studied and a production indicator map has to be constructed for each one of these reservoir models. The interpolation techniques used to date for constructing these maps are essentially based on kriging (Chilès, J. P., Delfiner, P., Geostatistics: Modeling Spatial Uncertainty. Wiley, New York, pp. 695, 1999) and they require several flow simulations. If the latter have to be performed for each reservoir model, the total number of flow simulations is significant.

SUMMARY OF THE INVENTION

The invention is an alternative method for developing a petroleum reservoir from a reservoir model. This alternative method is based on the construction of the production indicator map from the integration of information with different resolution levels which are a first level referred to as "approximate" level, for which the production indicators are approximated by fast flow simulations, and a second level, referred to as "precise" level, for which production indicators are determined by precise flow simulations. Therefore, with the method, a precise production indicator map is constructed while significantly reducing the use of complex flow simulators by reducing the computation times.

The invention relates to a method of developing an underground reservoir, notably a petroleum reservoir, traversed by at least a first well from which a fluid is produced, wherein a position of at least a second well to be drilled is determined by means of a production indicator map comprising a set of cells. Each cell is associated with a production indicator (IP) defining an impact, on the fluid production, of the addition of a well in this cell. The method comprises:

(1) constructing the map by:
   a) determining production indicators (IP) on a first group of cells of the map, by a flow simulation over a predetermined period of time, using a flow simulator and a reservoir model;
   b) determining production indicators (IP) on a second group of cells of the map, by the flow simulation wherein at least the predetermined period of time, the flow simulator or the reservoir model are modified;
   c) interpolating the production indicators (IP) on all the cells of the map, by an interpolation model constrained by the production indicators (IP); and
(2) defining the position of said the second well by the cell where the production indicator is a maximum.

According to the invention, the production indicator (IP) measures a variation of parameters impacting the fluid production when a well is added in the cell.

Preferably, the production indicator (IP) is a produced fluid volume increment produced by placing a well in the cell or a variation of the net value expected.

Advantageously, selection of the cells of the first and second groups is achieved by sampling.

According to one embodiment, modifying the predetermined period of time reduces the period of time.

Furthermore, modifying the flow simulator simplifies the flow simulator by disregarding some physical phenomena during the fluid flow.

Modifying the reservoir model can decrease the resolution of the reservoir model.

According to an embodiment, both the reservoir model and the flow simulator are modified.

Advantageously, the interpolation model is constructed using a method of co-kriging the production indicators (IP).

In a variant, stages a) to c) are repeated for various reservoir models, then a production indicator (IP) map corresponding to the mean of the production indicators (IP) calculated in each cell for the various reservoir models and a production indicator (IP) variance map are determined, and the position of the second well is defined by the cell satisfying a criterion relative to maximization of the mean and a minimization of the variance of the production indicators.

The invention also relates to a computer program product downloadable from a communication network and/or recorded on a computer readable medium and/or processor executable, comprising program code instructions for implementing the method according to the invention, when the program is executed on a computer.

According to the invention, exploratory drilling is performed in the position determined by the method.

BRIEF DESCRIPTION OF THE DRAWINGS

Other features and advantages of the method according to the invention will be clear from reading the description hereafter of embodiments given by way of non limitative example, with reference to the accompanying figures wherein.

DETAILED DESCRIPTION OF THE INVENTION

Figure 1:
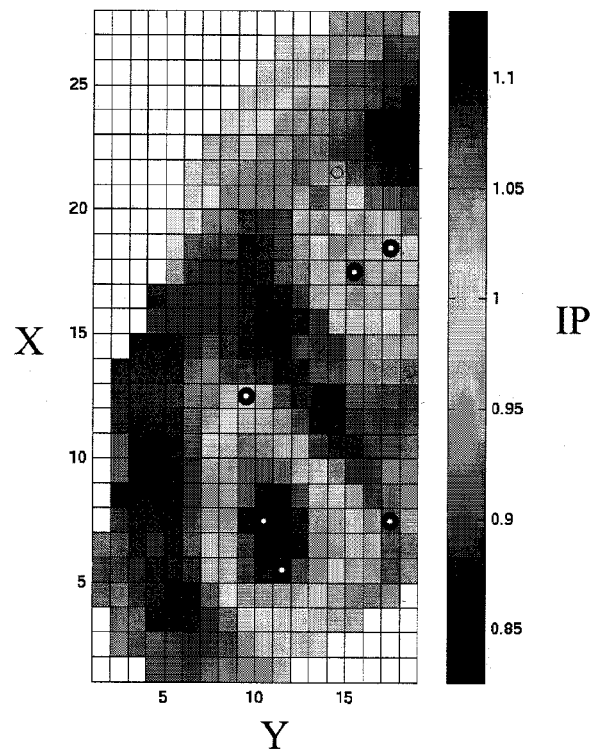
FIG. 1 illustrates a reference production indicator map.

The invention relates to a method of developing an underground reservoir, notably a petroleum reservoir, traversed by at least a first well from which a fluid is produced, wherein a position of at least a second well to be drilled is determined by means of a production indicator map comprising a set of cells wherein each cell is associated with a production indicator (IP) defining an impact, on the fluid production, of an additional at least a second well in this cell. The method comprises:

1) constructing the map by:
   a) determining precise production indicators;
   b) determining approximate production indicators;
   c) interpolation; and
2) defining a position of the second well.

Stage 1) Constructing the Production Indicator Map

A production indicator map comprises a set of cells with each cell being associated with a production indicator (IP). A production indicator (IP) quantifies an impact on the fluid production due to the addition of a well in this cell. The production indicator (IP) measures a variation of the parameters impacting the fluid production when a well is added in the cell. This production indicator (IP) can notably be a total production variation of all the wells, a variation of the net present value expected, or a pressure or a flow rate variation. According to an embodiment, the production indicator (IP) is the oil volume increment produced when placing a well such as an injection well for example, in this cell.

According to the invention, the production indicator map is constructed from production indicator values calculated precisely for the reservoir model being considered and from production indicator values approximated for certain previously selected cells. The values of these production indicators are then interpolated for all the cells of the map. Stages a) and b) described below are independent and they can be carried out in the order given below, in the opposite order or simultaneously.

a) Determining a First Series of Production Indicators

A first group of cells is first selected.

Advantageously, cells of the map to be estimated are selected from a sampling technique that can be entirely computerized, or computerized, then manually complemented, or achieved entirely manually. For example, the sampling technique can be a Latin hypercube technique based on a "Maximin" criterion, which allows the space to be divided into equiprobable subspaces sampled in a uniform manner. The cells represent the positions for which the impact on the production is to be assessed. The sampling method using the Latin hypercube technique affords the advantage of leading to a distribution of the selected cells covering reasonably the reservoir model. However, a zone of the map may be considered as promising in terms of well positioning and, in this case, sampling of the zone in question may be more precise in order to obtain more precise production indicators in this zone.

The production indicators ("precise" production indicators) are then determined precisely in these cells of the first group. The production indicator (IP) is determined for each cell selected by a "precise" flow simulation.

Preferably, a flow simulation is performed for each selected cell of the first group, assuming that a well is added in the selected cell. To carry out a flow simulation, well-known software known as a "flow simulator," such as Pumaflow® (IFP Energies nouvelles, France). Preferably, a simulation of the flow of the fluid contained in the reservoir to the production wells is carried out, for each selected cell, assuming that a well is added in the selected cell. These simulations are highly time consuming and are carried out from a precise flow simulator, that is a flow simulator accounting for all the physical phenomena during the fluid flow, notably the phase changes, the PVT effects. A software such as Pumaflow® corresponds to this definition because it describes the flow physics in the best possible way. In general terms, it is the simulator of interest from which it is desired to establish the precise production indicator map. It is selected in order to account for the flow physics in an optimum way. In order to determine these "precise" production indicators, the simulation is applied to the reservoir model for which the production indicator map is to be established. This model is referred to as "precise" because it corresponds precisely to the reservoir model examined. Besides, this simulation is performed over a predetermined period of time. The goal is to assess the impact of a new well on the production at a given time t.

Therefore, if, in the first group selection stage, Np cells are selected, Np flow simulations are carried out with, for each one, a single well is considered to be added in the cell. These simulations give the precise or "fine" value of the production indicator (IPp1, IPp2, . . . , IPpNp) for the selected cells.

b) Determining a Second Series of Production Indicators

A second group of cells is first selected. These cells correspond to the cells of the grid on which the reservoir model being studied is defined.

Advantageously, cells of the map to be estimated are selected from a sampling technique that can be entirely computerized, or computerized, then manually complemented, or achieved entirely manually. For example, said sampling technique can be a Latin hypercube technique based on a "Maximin" criterion, which allows the space to be divided into equiprobable subspaces sampled in a uniform manner. The cells represent the positions for which the impact on the production is to be assessed. The sampling method using the Latin hypercube technique affords the advantage of leading to an acceptable distribution of the selected cells. However, a zone of the map may be considered which is promising in terms of well positioning and, in this case, the sample zone in question may be more precisely sampled in order to enrich the assessment of the production indicators in this zone. It can be noted that, according to the invention, the two groups of cells are not necessarily disconnected. Some cells can belong to both groups. Stages a) and b) can thus be carried out independently of one another.

The production indicators ("approximate" production indicators) are then determined in these cells of the second group. The production indicator (IP) is determined for each cell selected by a fast (or "approximate") flow simulation.

According to a preferred embodiment, a simulation of the flow of the fluid contained in the reservoir to the production wells is carried out, for each selected cell, assuming that a well is added in the selected cell. Fast determination of the production indicators is obtained by modifying at least one of the following simulation conditions which are reduction of the simulated period of time, decrease in the reservoir model resolution or in the flow simulator precision.

According to a first variant of this embodiment, approximating the production indicators (referred to as "approximate" production indicators) can simulate the flows by means of the precise flow simulator used in the previous stage, applied to the reservoir model used in the previous stage, but over a shorter period of time than the period normally considered for assessing the impact of a new well on the production.

In a variant, flow simulations can be performed for the reservoir model being studied by a simplified flow simulator instead of the flow simulator used in the previous stage. What is referred to as a simplified flow simulator is a flow simulator using simplified mathematical equations of the implemented physics. These simplified equations are notably obtained by disregarding certain physical phenomena such as the capillary pressures in the reservoir for example. One then speaks of reduced physics. One simulator per stream line can for example be used. The simplified flow simulator thus is a simplified version of the flow simulator used in stage a) which allows an approximate representation of the fluid flows in the reservoir.

Another option to carrying out flow simulations by the flow simulator used in the previous stage applied to a reservoir model of lower resolution than the main reservoir model, is a model whose cell dimensions are larger than those of the reservoir model being studied. In this case, the cells of the second group are transposed to a grid of lower resolution by correspondence between the two grids upon scaling. Alternatively, the cells of the second group can be selected directly from the cells of a grid referred to as "approximate" and superposed on the initial map. This reservoir model thus corresponds to a low-resolution representation of the precise reservoir model and it is generally constructed from scaling techniques.

It is also possible to carry out flow simulations applied to the low-resolution reservoir model from the simplified flow simulator.

The advantage is a gain in the computation time in comparison with the simulations to be launched for assessing the exact (or precise) values of the production indicator.

Thus, according to this first preferred embodiment, a flow simulation is carried out for each selected cell and the associated ("approximate" or "coarse") production indicator is deduced therefrom. If, in the selection stage, Na cells are selected in the second group, Na flow simulations are performed with, for each one, a single well is considered which is added in the position. These simulations give an approximate value, referred to as coarse, of the production indicator (IPa1, IPa2 . . . IPaNa) for the cells selected. These simulations require a much shorter computation time so that the coarse information corresponds to a denser network.

c) Interpolation

In order not to have to determine the production indicators in all the cells of the map from a computation time consuming process such as a flow simulation, and therefore in order to decrease the computation time, the production indicator is assessed from an interpolation model in all the non-sampled cells of the map. Interpolation is based on an interpolation model constrained by the precise and approximate indicators determined in the previous stages.

Preferably, the interpolation model is a multi-fidelity meta-model whose construction is based on the co-kriging concept, which is a natural extension of the kriging method. The basic theory of the multi-fidelity approach is to constrain the meta-model by several information resolution levels. To simplify the notations, the case is limited to two levels which are the production indicators determined in stage b) (approximate) and the production indicators determined in stage a) (precise). The former allow detection of trends in the variations of the production indicators. The latter give exact values for given positions.

The two information levels are used to construct the production indicator map from co-kriging (Chilès, J. P., Delfiner, P., Geostatistics: Modeling Spatial Uncertainty. Wiley, New York, pp. 695, 1999) with adjustment of the interpolation model parameters.

The basic theory is to use an autoregressive model of the form as follows:

$$IPp(x)=pIPa(x)+\delta p(x) \text{ and } IPa(x)=\delta a(x)$$

p is a scale factor between the precise scale model and the approximate scale model. It is determined, as it is known, when using an approximate reservoir model for determining the approximate production indicators. IPp and IPa are the interpolation models at the precise and approximate scale respectively. $\delta p(x)$ represents the correction between the precise scale model and the approximate scale model. The precise (p) or approximate (a) production indicators in the cells selected are denoted by IP1, IP2, IPN.

An interpolation model of the approximate production indicators determined in stage b) is first constructed, which determines in each cell of the map a production indicator from known approximate production indicators. A Gaussian process (or kriging) is used:

$$IPa(x)=f(x,y,D \min, IPa1, IPa2, \ldots, IPaNa)$$

The cells are characterized by a set of regressors grouped in vector x. This set comprises at least the spatial coordinates x and y of the cells, and optionally also the distance Dmin between the cell to be interpolated and the closest well to the cell to be interpolated. The latter regressor can be introduced to account for the interferences between wells. The interpolation model parameters are determined by maximizing the associated likelihood function.

Similarly, a Gaussian process model (kriging) is applied for the correction term $\delta p(x)$:

$$\delta p(x)=f(x,y,D \min, IPp1, IPp2, \ldots, IPpNp, \rho)$$

The parameters of this model are also determined by maximizing the associated likelihood function.

After defining Gaussian processes for modelling IPa and $\delta p$, the production indicators IPp in each cell in the precise scale can be expressed using the following model:

$$IPp(x)=f(x,y,D \min, IPa1, IPa2, \ldots, IPpNp, IPp1, IPp2, \ldots, IPpNp, \rho)$$

Given the interpolation model being known, a determination by interpolation of the precise production indicators is performed in the non-selected cells of the map. Assessing precise production indicators by interpolation allows not using a supplementary simulator and reduces the computation time.

Stage 2) Defining the Position of the Second Well

The maximum value of the production indicator thus being constructed corresponds to the cell where it will be most advantageous to position a well. A well that is integrated into the group of existing wells is then added to the production scheme. The well can then be drilled subsequently.

When various reservoir models meeting the already collected data are available, the stages of constructing the production indicator map can be repeated for each reservoir model. This approach is possible because the approximate information is taken into account in the metamodel. In fact, adding this information allows the need for precise information to be reduced and therefore the use of the precise flow simulator, generally computation time consuming, to be limited. For each reservoir model, stages a) to c) are repeated and a set of precise production indicator maps that differ from one another due to the geological uncertainty is eventually obtained. The mean and the variance of these precise production indicator maps are then determined, which eventually gives a map showing the mean of the production indicators and a map showing the variance thereof. The invention thus allows construction of production indicator maps for several reservoir models, which makes it possible to account for the construction uncertainties of the reservoir models.

A well is then added to the production scheme by accounting for both the production gain (mean map) and the associated risk (variance map). The wells can then be drilled subsequently.

Application Example

To illustrate the method, a test case is elaborated within the context of the European project "Production forecasting with Uncertainty Quantification" (PUNQ) from a real petroleum reservoir. The field contains oil and gas. It is produced from 6 production wells located close to the oil-gas contact line. The base production scheme covers the period from Jan. 1, 1967 to Jan. 15, 1975. Many well tests are carried out during the first year. The wells are then closed for three years prior to being produced at an imposed flow rate during the last four years.

After these eight years, the question whether a water injection well should be added to maintain pressure in the reservoir arises. It is assumed that, from Jan. 15, 1975 to Jan. 15, 1980, production is controlled through the six production wells and an injection well. The problem is to identify the most strategic cell for the placement of the injection well.

A precise production indicator map (IPp) then has to be constructed using the method according to the invention and the position of the well has to be deduced therefrom.

The reservoir model is discretized on a grid having 19×28×5 cells, 1761 of which are active. This configuration leads us to construct a precise production indicator map on a grid having 19×28 cells, 396 of which can receive a new well. The base case corresponds to the cumulative oil volume produced by the six production wells on Jan. 15, 1980 in the absence of any injection well. The precise production indicator assigned to a cell of the precise production indicator map corresponds to the extra amount of oil produced when an injection well is placed in the cell considered.

Since the goal is in fine to use the precise flow simulator as little as possible, an "approximate" information level that supplements the "precise" information level is taken into account. The approximate information level is determined from flow simulations performed for the reservoir model being studied, but over a limited period of time. Instead of calculating the production indicator for a water injection between January 1975 and January 1980, an injection between January 1975 and January 1976 is simulated. The simulations thus performed give access to approximate production indicator values.

Figure 5:
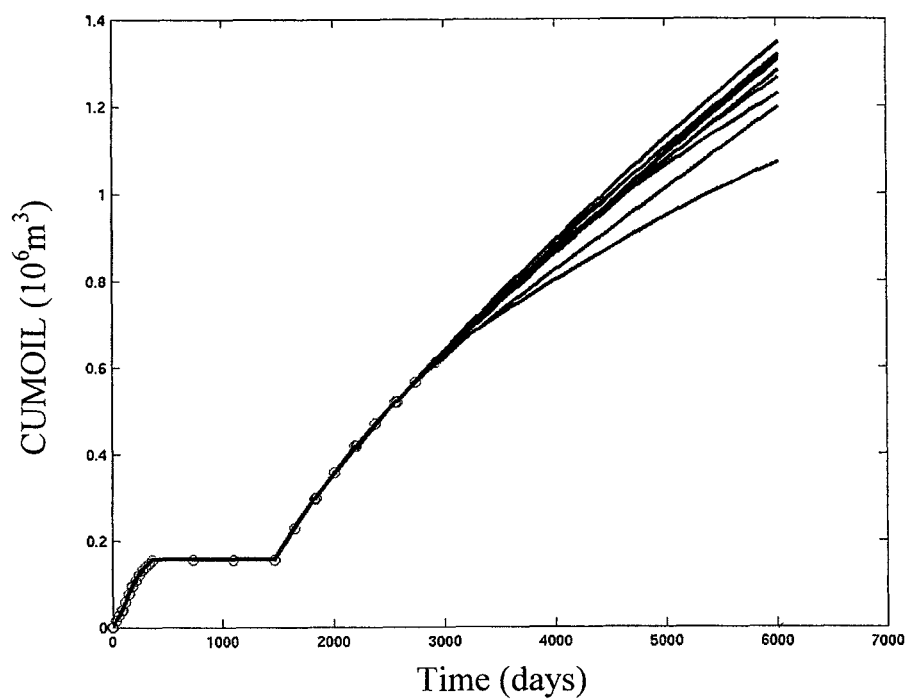
FIG. 5 shows the evolution of the total volume of oil produced as a function of time for various reservoir models.

The first stage constructs several reservoir models meeting the production data collected during 1967 and 1975, which is done by a conventional history matching approach. Thus, ten base models are obtained allowing apprehending the geological uncertainty linked with the spatial distribution of the heterogeneities in the reservoir. These ten models meet the measured production data such as, for example, the total volume of oil produced. On the other hand, after 1975, their behaviors differ due to the geological uncertainty. FIG. 5 illustrates the total volume of oil produced designated as "CUMOIL" on the ordinate as a function of time for ten reservoir models. These ten models meet the data measured during the first eight years (circles). After that, their behaviours differ.

It is now desirable to construct a precise production indicator map for each model being considered. In order to reduce the computation times, these maps are constructed by integrating precise level information and supplementary approximate level information. The number of cells for which the precise production indicators are calculated is decreased and thus the computation time required for determining the precise level information.

By way of example, focus is on the first reservoir model. It can be noted that a flow simulation for the PUNQ case requires a very limited computation time. Under such very particular conditions, it is entirely possible to carry out a flow simulation for all the possible cells, which gives access to the exact map of fine production indicators. This exact production indicator map is illustrated in FIG. 1, where the thick black circles show the position of the existing production wells.

Figure 3:
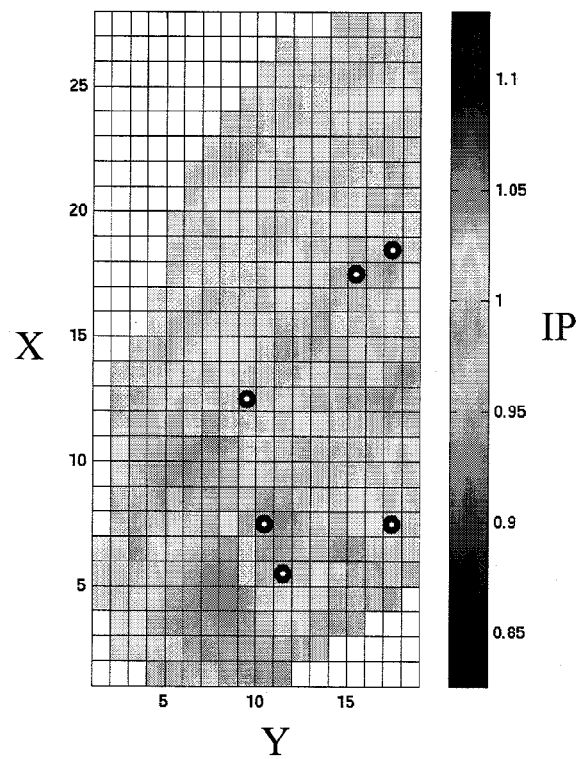
FIG. 3 illustrates a production indicator map obtained by integration of the "approximate" production indicators.

The approximate information corresponding to an approximate production indicator map obtained from a flow simulated limited to the 1975-1976 period is now considered. The precise information is given by precise production indicators calculated exactly for fifteen possible positions, drawn at random, for the injection well. The approximate production indicator map for the first reservoir model is shown in FIG. 3. It requires only a negligible computation time since the simulation period is reduced.

Figure 2:
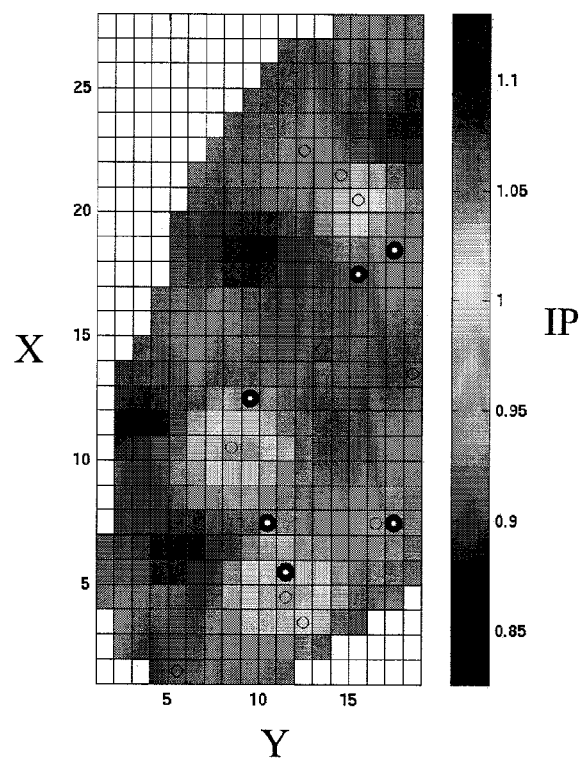
FIG. 2 illustrates a production indicator map obtained by integration of the "precise" production indicators.

The production indicators are assessed precisely in fifteen cells, which involves fifteen flow simulations over the complete 1975-1980 period. By way of comparison, the precise production indicator map is constructed by accounting for the precise information only. This map is illustrated in FIG. 2 (for the first reservoir model). For FIGS. 2 and 3, the fine black circles represent the fifteen positions for which the production indicators (precise or approximate) are calculated.

Figure 4:
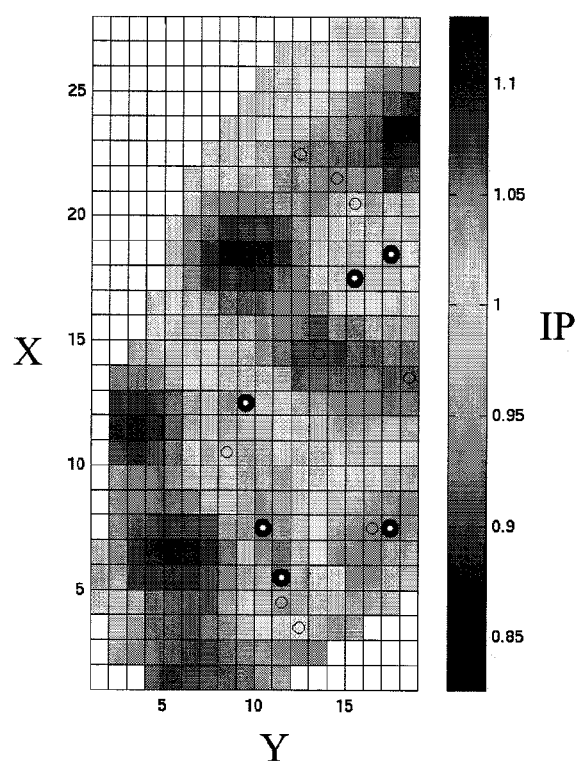
FIG. 4 illustrates a production indicator map obtained with the method according to the invention.

According to the method of the invention the production indicator map for the first reservoir model is constructed, which is illustrated in FIG. 4. The production indicator map constructed from a multi-fidelity metamodel integrating the two information levels is checked to be much closer to the reference indicator map. To reach a similar result with only precise information (FIG. 3), it can be shown that about twice as many flow simulations (about thirty) are required over the complete period of time, which involves a significant computation time.

Figure 6:
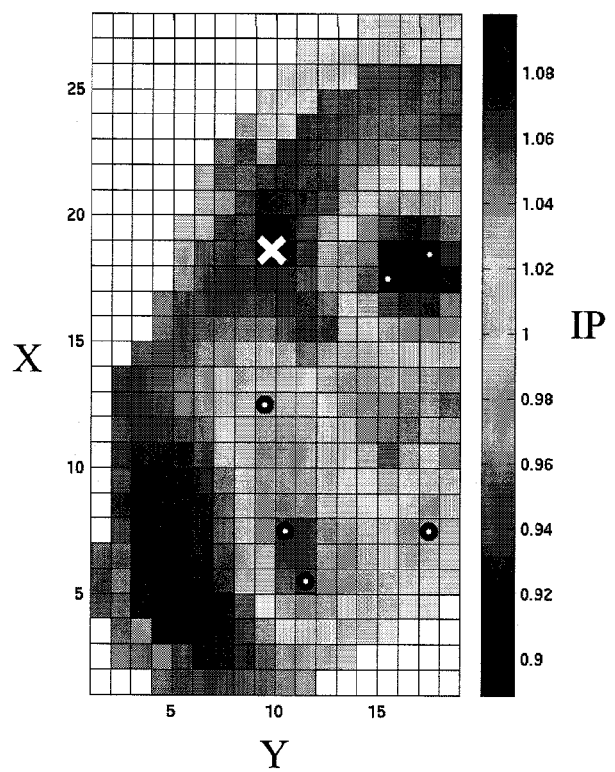
FIG. 6 illustrates a production indicator map obtained with the method according to the invention by averaging the production indicator maps calculated for various reservoir models.
Figure 7:
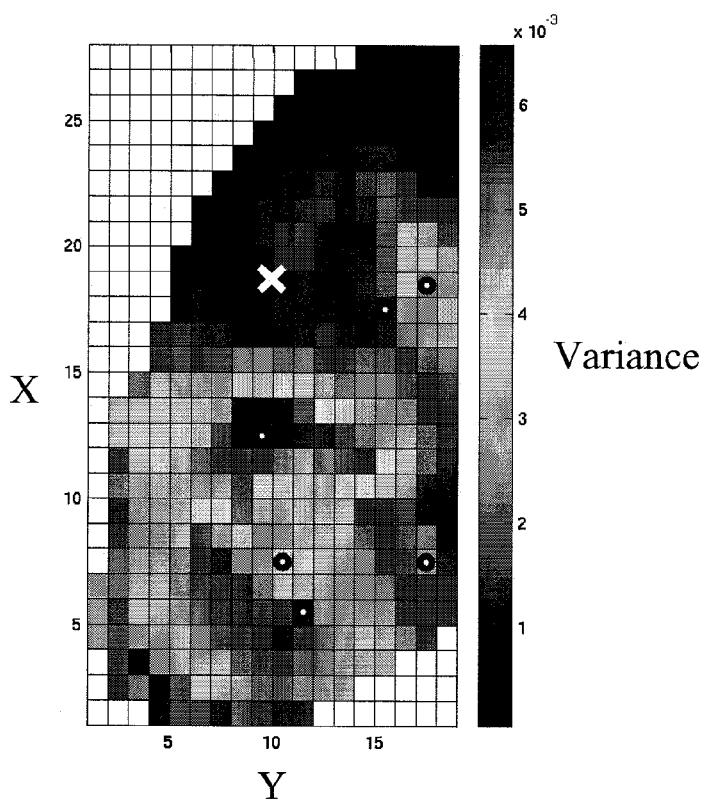
FIG. 7 illustrates a production indicator variance map obtained with the method according to the invention for various reservoir models.

The computation time gain linked with the use of a multi-fidelity metamodel enables consideration of constructing the indicator map for each one of the ten reservoir models. Then maps are deduced showing the mean (FIG. 6) and the variance (FIG. 7) of the production indicators. These two maps allow selection of the position of the new injection well while knowing the associated risk, which is linked with the geological uncertainty. For example, a recommendation to position the new injection well at the point shown by the cross because it is associated with a significant production gain and a reduced risk is made.

The invention claimed is:

1. A computer implemented method of developing an underground reservoir traversed by at least a first well from which a fluid is produced, wherein a position of at least a second well to be drilled is determined by a production indicator map comprising a set of cells with each cell being associated with a production indicator defining an impact, on fluid production, of an addition of the at least the second well in a cell, comprising:
   1) constructing the map by:
      a) determining, using a computer, production indicators for a first group of cells of the map, by a flow simulation over a predetermined period of time using a flow simulator and a reservoir model;
      b) determining, using the computer, production indicators for a second group of cells of the map, by the flow simulation wherein at least one of the predetermined period of time, the flow simulator, or the reservoir model is modified; and
      c) interpolating, using the computer, the production indicators for all cells of the map, by an interpolation model constrained by the production indicators; and
   2) defining, using the computer, a position of the at least the second well in the cell where the production indicator is a maximum.

2. A method as claimed in claim 1, wherein:
the production indicator measures a variation of parameters impacting the fluid production when the at least the second well is added in the cell.

3. A method as claimed in claim 2, wherein:
the production indicator is a produced fluid volume increment produced by placing a well in the second cell or a variation of the net expected value.

4. A method as claimed in claim 3, wherein:
the production indicator is a fluid volume increment produced by placing the at least the second well in the cell or a variation of the net expected value.

5. A method as claimed in claim 3, wherein:
modifying the predetermined period of time is a reduction of the period of time.

6. A method as claimed in claim 2, wherein:
the production indicator is a fluid volume increment produced by placing the at least the second well in the cell or a variation of the net expected value.

7. A method as claimed in claim 2, wherein:
modifying the predetermined period of time is a reduction of the period of time.

8. A method as claimed in claim 7, wherein:
modifying the flow simulator is by simplifying the flow simulator by disregarding some physical phenomena occurring during the fluid flow.

9. A method as claimed in claim 7, wherein:
modifying the reservoir model decreases resolution of the reservoir model.

10. A method as claimed in claim 7, wherein:
the reservoir model and the flow simulator are modified.

11. A method as claimed in claim 2, wherein:
modifying the flow simulator is by simplifying the flow simulator by disregarding physical phenomena occurring during the fluid flow.

12. A method as claimed in claim 11, wherein:
modifying the reservoir model decreases resolution of the reservoir model.

13. A method as claimed in claim 11, wherein:
the reservoir model and the flow simulator are modified.

14. A method as claimed in claim 2, wherein:
modifying the reservoir model decreases resolution of the reservoir model.

15. A method as claimed in claim 14, wherein:
the reservoir model and the flow simulator are modified.

16. A method as claimed in claim 2, wherein:
the reservoir model and the flow simulator are modified.

17. A method as claimed in claim 2, wherein:
the interpolation model is constructed by co-kriging the production indicators.

18. A method as claimed in claim 2, wherein:
stages a) to c) are repeated for the reservoir model, then a production indicator map corresponding to a mean of the production indicators calculated in each cell for the reservoir model and a production indicator variance map are determined, and a position of the at least a second well is chosen for a cell satisfying a criterion relative to maximization of the mean and minimization of variance of the production indicators.

19. A method as claimed in claim 1, wherein:
the production indicator is a produced fluid volume increment produced by placing the at least the second well in the cell or a variation of a net expected value.

20. A method as claimed in claim 19, wherein:
the production indicator is a fluid volume increment produced by placing the at least the second well in the cell or a variation of the net expected value.

21. A method as claimed in claim 19, wherein:
modifying the predetermined period of time is a reduction of the period of time.

22. A method as claimed in claim 19, wherein:
modifying the flow simulator is by simplifying the flow simulator by disregarding physical phenomena occurring during the fluid flow.

23. A method as claimed in claim 19, wherein:
modifying the reservoir model decreases resolution of the reservoir model.

24. A method as claimed in claim 19, wherein:
the reservoir model and the flow simulator are modified.

25. A method as claimed in claim 1, wherein:
the production indicator is a fluid volume increment produced by placing the at least the second well in the cell or a variation of the net expected value.

26. A method as claimed in claim 25, wherein:
modifying the predetermined period of time is a reduction of the period of time.

27. A method as claimed in claim 25, wherein:
modifying the flow simulator is by simplifying the flow simulator by disregarding physical phenomena occurring during the fluid flow.

28. A method as claimed in claim 25, wherein:
modifying the reservoir model decreases resolution of the reservoir model.

29. A method as claimed in claim 25, wherein:
the reservoir model and the flow simulator are modified.

30. A computer program product downloadable from a communication network and/or recorded on a computer readable medium and/or processor which is executable on a programmed processor, comprising program code instructions for computer implementing the method of developing an underground reservoir traversed by at least a first well from which a fluid is produced, wherein a position of at least a second well to be drilled is determined by a production indicator map comprising a set of cells with each cell being associated with a production indicator defining an impact, on fluid production, of an addition of the at least the second well in a cell, the programmed processor executing the program code instructions to perform the steps comprising:
  1) constructing the map by:
    a) determining production indicators for a first group of cells of the map, by a flow simulation over a predetermined period of time using a flow simulator and a reservoir model;
    b) determining production indicators for a second group of cells of the map, by the flow simulation wherein at least one of the predetermined period of time, the flow simulator, or the reservoir model is modified; and
    c) interpolating the production indicators for all cells of the map, by an interpolation model constrained by the production indicators; and
  2) defining a position of at least the second well in the cell where the production indicator is a maximum.

31. A method as claimed in claims 2, comprising:
performing exploratory drilling is performed at predetermined position.

* * * * *